United States Patent
Wakabayashi

(10) Patent No.: US 9,330,950 B2
(45) Date of Patent: May 3, 2016

(54) SUBSTRATE PROCESSING APPARATUS

(75) Inventor: Shinji Wakabayashi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 861 days.

(21) Appl. No.: 12/723,950

(22) Filed: Mar. 15, 2010

(65) Prior Publication Data

US 2010/0236718 A1    Sep. 23, 2010

Related U.S. Application Data

(60) Provisional application No. 61/176,586, filed on May 8, 2009.

(30) Foreign Application Priority Data

Mar. 17, 2009 (JP) ................................. 2009-063954

(51) Int. Cl.
*H01L 21/677* (2006.01)
*H01J 37/32* (2006.01)

(52) U.S. Cl.
CPC ..... *H01L 21/67778* (2013.01); *H01J 37/32743* (2013.01); *H01J 37/32788* (2013.01); *H01L 21/67745* (2013.01)

(58) Field of Classification Search
CPC .................. H01L 21/67745; H01L 21/67754; H01L 21/67778; H01L 21/67781; H01L 21/67763; H01L 21/67769; H01J 37/32743; H01J 37/32788
See application file for complete search history.

(56) References Cited

U.S. PATENT DOCUMENTS

| | | | | |
|---|---|---|---|---|
| 4,668,484 A | * | 5/1987 | Elliott | 422/113 |
| 5,296,036 A | * | 3/1994 | Matsuyama et al. | 118/718 |
| 5,788,448 A | * | 8/1998 | Wakamori et al. | 414/222.02 |
| 6,053,688 A | * | 4/2000 | Cheng | 414/416.03 |
| 6,098,304 A | * | 8/2000 | Manjkow et al. | 34/79 |
| 6,152,669 A | * | 11/2000 | Morita et al. | 414/217 |
| 6,302,927 B1 | * | 10/2001 | Tanigawa | 29/25.01 |
| 2002/0192055 A1 | * | 12/2002 | Kobayachi et al. | 414/200 |
| 2003/0031537 A1 | | 2/2003 | Tokunaga | |

(Continued)

FOREIGN PATENT DOCUMENTS

| | | | |
|---|---|---|---|
| JP | 61287636 A | * | 12/1986 |
| JP | 61287637 A | * | 12/1986 |

(Continued)

*Primary Examiner* — Jeffrie R Lund
*Assistant Examiner* — Yuechuan Yu
(74) *Attorney, Agent, or Firm* — Rothwell, Figg, Ernst & Manbeck, P.C.

(57) ABSTRACT

A substrate processing apparatus includes a processing unit performing a predetermined processing on a substrate; a transfer chamber; and a substrate accommodation unit including a substrate accommodation chamber communicating with the transfer chamber via a transfer opening, a gate provided at the transfer opening to separate the substrate accommodation chamber from the transfer chamber, and a gas supply unit supplying a gas into the substrate accommodation chamber. The substrate accommodation chamber accommodates therein substrates that have been processed by the processing unit, and the gas supply unit provides a gas flow suppressing an atmosphere of the transfer chamber from being introduced into the substrate accommodation chamber, thereby preventing undesired reaction between moisture in the atmosphere of the transfer chamber and deposits adhered on the processed substrates accommodated in the substrate accommodation chamber.

5 Claims, 3 Drawing Sheets

(56) References Cited

U.S. PATENT DOCUMENTS

| | | | |
|---|---|---|---|
| 2004/0062627 A1* | 4/2004 | Aggarwal et al. | 414/217 |
| 2004/0250519 A1* | 12/2004 | Wu et al. | 55/385.2 |
| 2004/0258840 A1* | 12/2004 | Chen | 427/255.394 |
| 2005/0103270 A1* | 5/2005 | Yoshida et al. | 118/718 |
| 2005/0252571 A1* | 11/2005 | Nakano et al. | 141/66 |
| 2006/0215347 A1* | 9/2006 | Wakabayashi | 361/234 |
| 2008/0050924 A1* | 2/2008 | Wakabayashi | 438/706 |
| 2008/0053957 A1* | 3/2008 | Wakabayashi | 216/67 |
| 2008/0156679 A1* | 7/2008 | Bonora et al. | 206/320 |
| 2009/0016862 A1* | 1/2009 | Gould et al. | 414/225.01 |
| 2009/0317214 A1* | 12/2009 | Hsiao et al. | 414/217 |
| 2010/0143081 A1* | 6/2010 | Oh et al. | 414/217.1 |

FOREIGN PATENT DOCUMENTS

| | | | | |
|---|---|---|---|---|
| JP | 10189685 A | * | 7/1998 | |
| JP | 2000-18832 | * | 1/2000 | F27B 17/00 |
| JP | 2000018832 A | * | 1/2000 | |
| JP | 2001-77172 A | | 3/2001 | |
| JP | 2003-45933 | | 2/2003 | |
| JP | 2004128428 A | * | 4/2004 | |
| JP | 2007005604 A | * | 1/2007 | |
| KR | 2003059573 A | * | 7/2003 | |
| SU | 1534260 A | * | 1/1990 | |
| WO | WO 9311560 A1 | * | 6/1993 | |
| WO | WO 2008120716 A1 | * | 10/2008 | |

* cited by examiner

SUBSTRATE PROCESSING APPARATUS

CROSS-REFERENCE TO RELATED APPLICATIONS

This application claims priority to Japanese Patent Application No. 2009-063954 filed on Mar. 17, 2009, the entire contents of which are incorporated herein by reference.

FIELD OF THE INVENTION

The present invention relates to a substrate processing apparatus for performing processing such as film formation, etching or the like on a substrate such as a semiconductor wafer or the like.

BACKGROUND OF THE INVENTION

Conventionally, in a semiconductor device manufacturing field, a plurality of e.g., 25 substrates such as semiconductor wafers or the like is transferred while being accommodated in a carrier (substrate accommodation container) such as a FOUP (Front Opening Unified Pod) or the like.

An inner space of the carrier such as a FOUP or the like can be sealed and the carrier is transferred in a sealed state between process steps. Meanwhile, as for a substrate processing apparatus for unloading a substrate from the carrier and performing a film formation, an etching or the like on the substrate, there is known a substrate processing apparatus including: a processing module for processing a substrate; and a transfer module having a transfer chamber provided with a loading/unloading port for mounting thereon a carrier and a transfer mechanism installed in the transfer chamber. Moreover, there is also known a substrate processing apparatus including a purge mechanism for supplying an inert gas into a FOUP mounted on a loading/unloading port and replacing the atmosphere in the FOUP (e.g., Japanese Patent Application Publication No. 2003-45933 and its corresponding U.S. Patent Application Publication No. 2003-031537).

Besides, there is suggested a substrate storage technique for accommodating processed substrates in a storage for the purpose of separating unprocessed substrates from the processed substrates and removing deposits so that the unprocessed substrates are prevented from being adversely affected by the deposits such as by-products or the like adhered onto substrates during processing of the substrates.

However, in case of the above-described conventional substrate processing apparatus having the purge mechanism for purging the FOUP with the inert gas, the atmosphere in the FOUP is replaced by purging the FOUP with the inert gas or the like while a front opening of the FOUP is fully opened during processing of a plurality (e.g., 25) of substrates (one lot) accommodated in the FOUP, so that the atmosphere can be introduced into the FOUP through the front opening. Hence, a first processed substrate of a lot is exposed to the atmosphere for a long period of time until the last processed substrate of the lot returns to the FOUP and may undesirably react with moisture in the atmosphere or the like.

Also in the storage technique for accommodating processed substrates in a storage, the processed substrates are exposed to the atmosphere and may undesirably react with moisture in the atmosphere or the like.

For example, when a target layer is plasma-etched by using fluorine-containing gas so that copper wiring formed under the etching target layer is exposed, hydrofluoric acid is generated from a reaction between by-products containing fluorine and moisture in the atmosphere, which may lead to corrosion of the copper wiring.

SUMMARY OF THE INVENTION

In view of the above, the present invention provides a substrate processing apparatus capable of preventing undesired reaction between deposits adhered onto a processed wafer and the atmosphere or moisture in the atmosphere.

In accordance with an embodiment of the present invention, there is provided a substrate processing apparatus including: a processing module including a processing unit for performing a predetermined processing on a substrate accommodated in a processing chamber; a transfer module including a transfer chamber having a loading/unloading port for mounting thereon a carrier accommodating therein the substrate in a plural number and a transfer mechanism for transferring the substrates between the processing module and the carrier mounted on the loading/unloading port in the transfer chamber; and a substrate accommodation unit including a substrate accommodation chamber communicating with the transfer chamber via a transfer opening and accommodating therein the substrates arranged vertically; a vertically movable gate provided at the transfer opening, the gate separating the substrate accommodation chamber from the transfer chamber; and a gas supply unit for supplying a gas into the substrate accommodation chamber.

Herein, the substrates that have been processed by the processing unit are accommodated in the substrate accommodation chamber.

Further, the gate may have a loading/unloading opening formed as a slit-shaped opening extending in a horizontal direction, and the gate is vertically moved to allow the loading/unloading opening to be a loading position and an unloading position so that the substrates are loaded into and unloaded from the substrate accommodation chamber.

Further, the gas supply unit may supply a gas from a rear side of the substrate accommodation chamber, and a gas flow gap may be provided between the gate and the substrate accommodation chamber in order to discharge the gas supplied from the gas supply unit to the outside of the substrate accommodation chamber.

Further, at least the substrate processed last by the processing unit among the substrates accommodated in the carrier mounted on the loading/unloading port may be directly transferred back to the carrier without being transferred to the substrate accommodation chamber.

Further, the processed substrates in the substrate accommodation unit may be transferred back to the carrier while the last substrate among the substrates accommodated in the carrier is processed by the processing unit.

In accordance with the present invention, it is possible to provide a substrate processing apparatus capable of preventing undesired reaction between deposits adhered onto a processed wafer and the atmosphere or moisture in the atmosphere.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENT

The embodiments of the substrate processing apparatus of the present invention will be described in detail with reference to the accompanying drawings which form a part hereof.

Figure 1A:
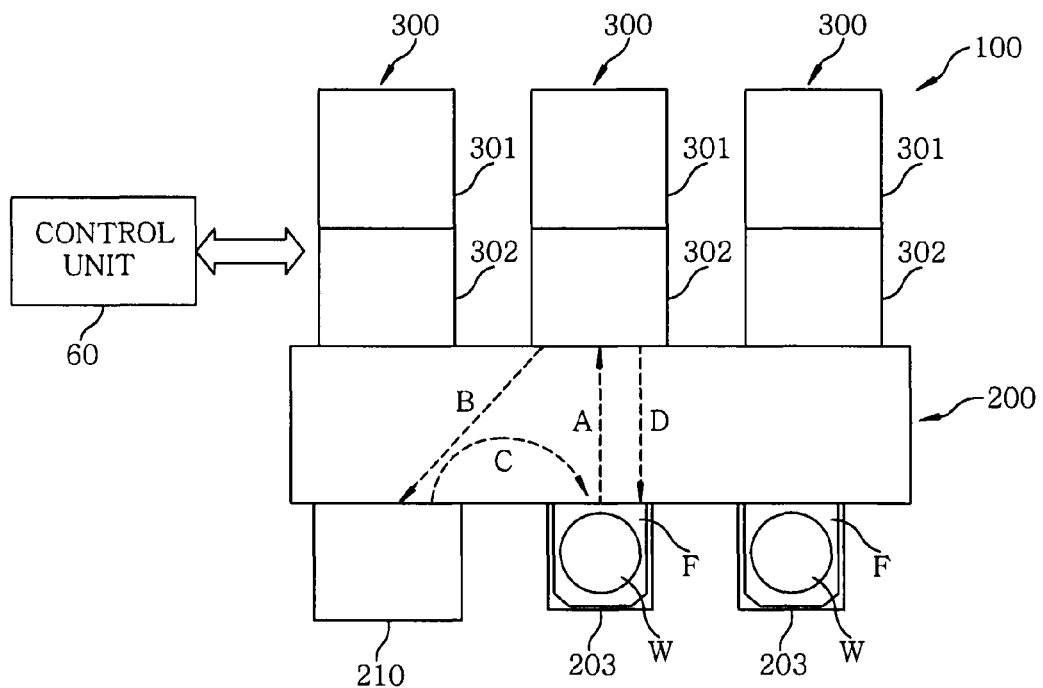
FIGS. 1A and 1B schematically show an entire configuration of a substrate processing apparatus in accordance with an embodiment of the present invention.
Figure 1B:
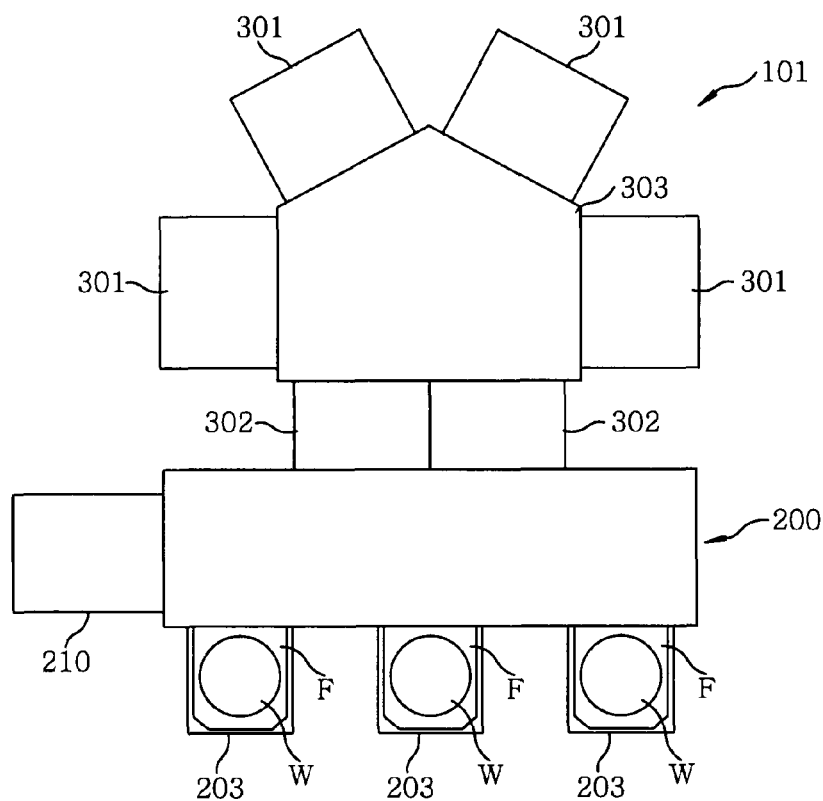

FIGS. 1A and 1B show an entire configuration of a plasma etching apparatus for performing plasma etching on a semiconductor wafer which is an example of a substrate processing apparatus in accordance with an embodiment of the present invention. As shown in FIG. 1A, a substrate processing apparatus 100 has a configuration in which a plurality of (e.g., three in the example of FIG. 1A) processing modules 300 is connected to a single transfer module 200 for transferring a semiconductor wafer in the atmosphere.

Each of the processing modules 300 has a processing unit 301 for performing a predetermined processing, e.g., a plasma etching in the present embodiment, on a substrate accommodated in a processing chamber. Processing units 301 are connected to the transfer module 200 via load-lock chambers 302.

Figure 2A:
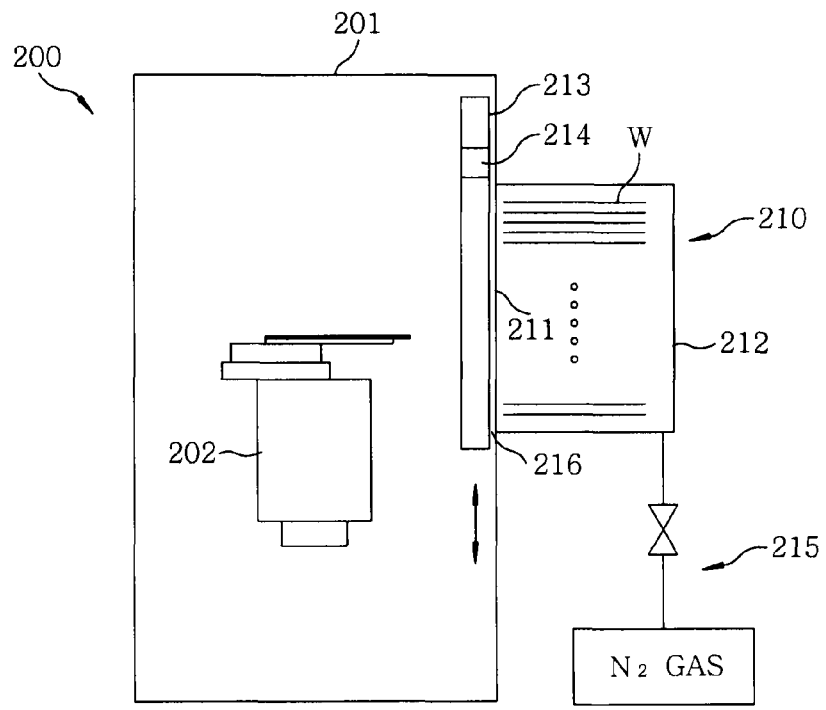
FIGS. 2A and 2B provide vertical cross sectional views describing a configuration of principal parts of the substrate processing apparatus shown in FIGS. 1A and 1B.
Figure 2B:
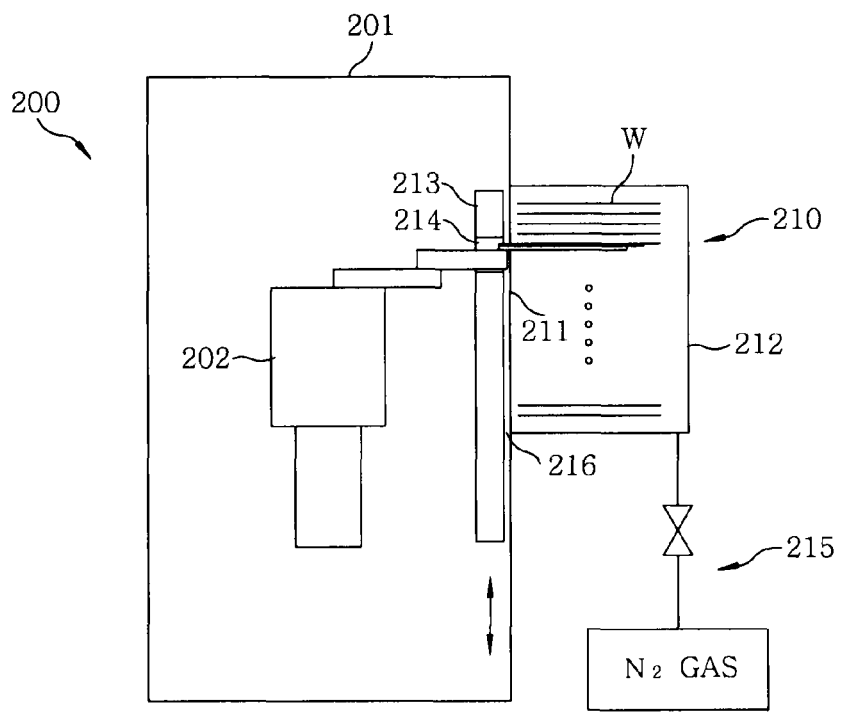

As illustrated in FIGS. 2A and 2B, the transfer module 200 has a transfer chamber 201 maintained under an atmospheric atmosphere, and a transfer mechanism 202 for transferring a semiconductor wafer W is disposed in the transfer chamber 201.

Moreover, as shown in FIG. 1A, a plurality of loading/unloading ports 203 (two in FIG. 1A), each for mounting thereon a FOUP (carrier) F accommodating therein semiconductor wafers W, is provided at a side of the transfer chamber 201 which is opposite to a side where the processing modules 300 are disposed. Furthermore, a substrate accommodation unit 210 is provided side by side with the loading/unloading ports 203.

As illustrated in FIGS. 2A and 2B, the substrate accommodation unit 210 has a substrate accommodation chamber 212 communicating with the transfer chamber 201 via a transfer opening 211. A plurality of semiconductor wafers W is accommodated in the substrate accommodation chamber 212 while being vertically arranged and spaced in substantially parallel with one another. Further, the transfer opening 211 has a vertically movable gate 213 which defines the substrate accommodation chamber 212 and the transfer chamber 201. The gate 213 is provided with a loading/unloading opening 214 formed as a slit-shaped opening extending in a horizontal direction.

The loading/unloading opening 214 provided at the gate 213 has a minimum dimension which allows a single semiconductor wafer W to be loaded and unloaded at one time, and a vertical opening width thereof is, e.g., about 30 mm to 50 mm. By vertically moving the gate 213, the loading/unloading opening 214 can move to a loading/unloading position at which the semiconductor wafer W can be loaded into and unloaded from the substrate accommodation chamber 212. FIG. 2A shows a state where the transfer opening 211 is closed by the gate 213, and FIG. 2B depicts a state where the semiconductor wafer W is loaded and unloaded by moving the loading/unloading opening 214 of the gate 213 to the loading/unloading position and inserting a substrate holder of the transfer mechanism 202 into the substrate accommodation chamber 212.

In addition, the substrate accommodation unit 210 has a gas supply unit 215 for supplying an inert gas (e.g., $N_2$ gas, Ar gas, He gas ($N_2$ gas in the present embodiment)) into the substrate accommodation chamber 212 from the rear side of the substrate accommodation chamber 212. Further, a gas flow gap 216 is formed between the substrate accommodation chamber 212 and the gate 213. $N_2$ gas supplied from the gas supply unit 215 into the substrate accommodation chamber 212 traverses the substrate accommodation chamber 212 from the rear side of the substrate accommodation chamber 212 and then is discharged to the outside through the gas flow gap 216 formed at the front side. Accordingly, the inside of the substrate accommodation chamber 212 can be maintained under the $N_2$ gas atmosphere.

Figure 3:
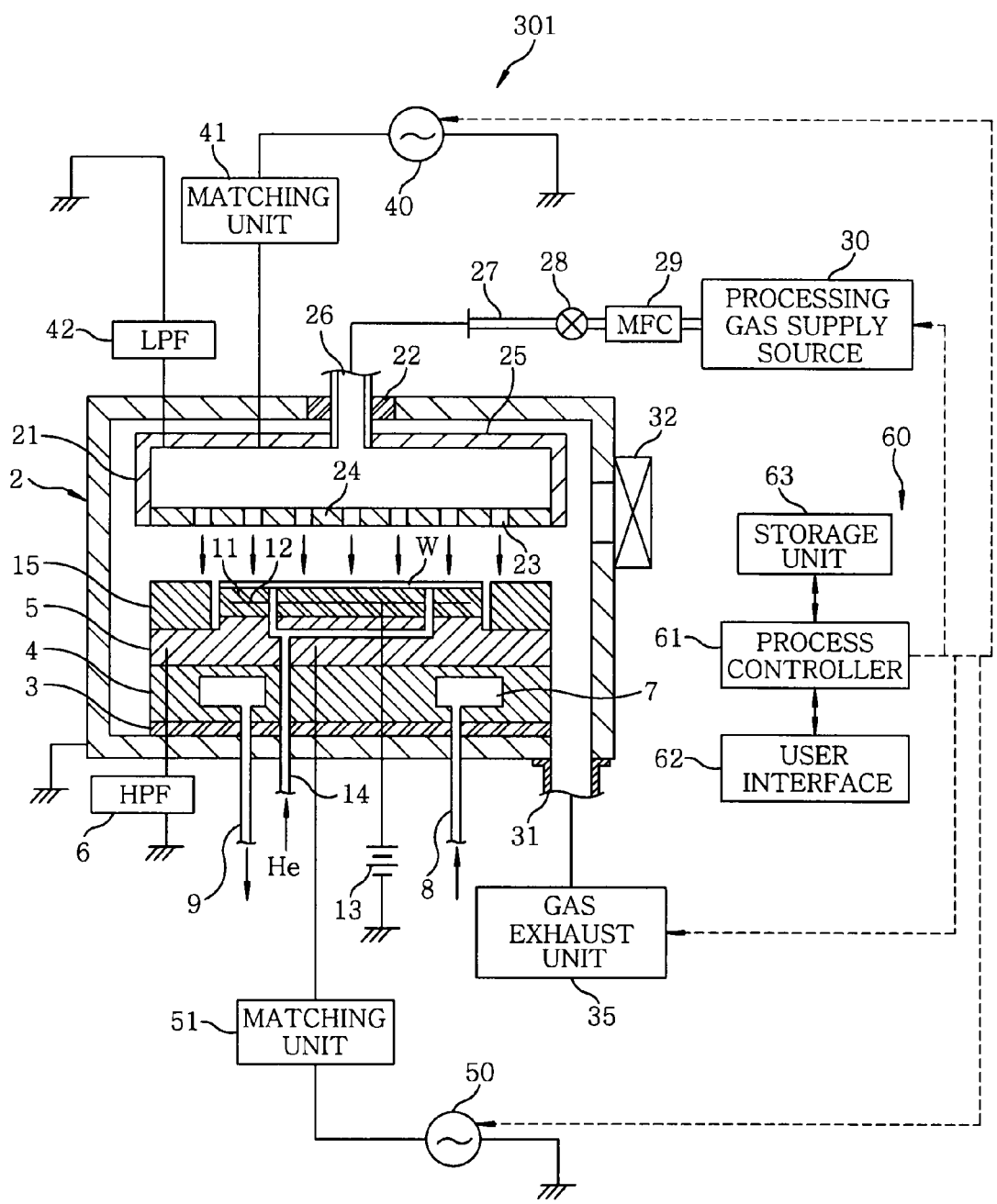
FIG. 3 offers a vertical cross sectional view depicting a configuration of principal parts of the substrate processing apparatus shown in FIGS. 1A and 1B.

Hereinafter, the configuration of the processing unit 301 of the processing module 300 will be described with reference to FIG. 3. The processing unit 301 has a cylindrical processing chamber (processing vessel) 2 made of, e.g., aluminum having an anodically oxidized surface or the like, and the processing chamber 2 is frame grounded. A substantially columnar susceptor support 4 for mounting thereon the semiconductor wafer W is installed at a bottom portion of the processing chamber 2 via an insulating plate made of ceramic or the like. Moreover, a susceptor (mounting table) 5 serving as a lower electrode is mounted on the susceptor support 4. The susceptor 5 is connected to a high pass filter (HPF) 6.

A coolant path 7 is formed inside the susceptor support 4. A coolant is introduced into and circulated along the coolant path 7 via a coolant introduction pipe 8, and then is discharged via a coolant discharge line 9. A cold heat of the coolant is transferred to the semiconductor wafer W via the susceptor 5, so that the semiconductor wafer W is controlled at a desired temperature.

The susceptor 5 is formed in a disc shape having an upper central portion protruded higher than its peripheral portion, and an electrostatic chuck 11 having substantially the same shape as that of the semiconductor wafer W is disposed on the upper central portion. The electrostatic chuck 11 is formed by embedding an electrode 12 between a pair of insulating members. Further, the semiconductor wafer W is electrostatically attracted to and held on the electrostatic chuck 11 by, e.g., Coulomb force generated by applying a DC voltage of, e.g., about 1.5 kV, to the electrode 12 from a DC power supply 13 connected thereto.

A gas channel 14 for supplying a heat transfer medium (e.g., He gas or the like) to the backside of the semiconductor wafer W is formed through the insulating plate 3, the susceptor support 4, the susceptor 5 and the electrostatic chuck 11. A cold heat of the susceptor 5 is transferred to the semiconductor wafer W through the heat transfer medium, so that the semiconductor wafer W can be maintained at a predetermined temperature.

An annular focus ring 15 is disposed at an upper peripheral portion of the susceptor 5 so as to surround the semiconductor wafer W mounted on the electrostatic chuck 11. The focus ring 15 is made of a conductive material, e.g., silicon or the like, and serves to improve etching uniformity.

An upper electrode 21 is provided above the susceptor 5 to face the susceptor 5 in parallel. The upper electrode is supported at an upper portion of the processing chamber 2 via an insulating member 22. The upper electrode 21 includes an electrode plate 24; and an electrode support 25 that serves to support the electrode plate 24 and is made of a conductive material. The electrode plate 24 is made of a semiconductor or a conductor, e.g., Si, SiC or the like, and has a plurality of gas injection openings 23. The electrode plate 24 includes a surface facing the susceptor 5.

A gas inlet port 26 is provided at a center of the electrode support 25 of the upper electrode 21, and is connected to a gas supply line 27. Further, the gas supply line 27 is connected to a processing gas supply source 30 via a valve 28 and a mass flow controller (MFC) 29. An etching gas for plasma etching is supplied from the processing gas supply source 30.

A gas exhaust line 31 is connected to the bottom portion of the processing chamber 2, and a gas exhaust unit 35 is connected to the gas exhaust line 31. The gas exhaust unit 35 has a vacuum pump such as a turbo molecular pump or the like and is configured to exhaust the inside of the processing chamber 2 to a predetermined depressurized atmosphere to a predetermined vacuum level, e.g., a pressure of about 1 Pa or less. Moreover, a gate valve 32 is installed at a sidewall of the processing chamber 2. The semiconductor wafer W is transferred between the processing chamber 2 and an adjacent load-lock chamber (load-lock chamber 302 in FIG. 1A) while the gate valve 32 is opened.

A first high frequency power supply 40 is connected to the upper electrode 21 via a matching unit 41. Further, a low pass filter (LPF) 42 is connected to the upper electrode 21. The first high frequency power supply 40 has a frequency range from about 27 MHZ to 150 MHz. By applying the high frequency power in such a high frequency range, a high-density plasma in a desirable dissociated state can be generated in the processing chamber 2.

A second high frequency power supply 50 is connected to the susceptor 5 serving as a lower electrode via a matching unit 51. The second high frequency power supply 50 has a frequency range lower than that of the first high frequency power supply 40. By applying a power of a frequency in such a range, a proper ionic action can be applied to the semiconductor wafer W as a substrate to be processed without causing any damage thereon. The frequency of the second high frequency power supply 50 is preferably determined within a range from, e.g., about 1 to 20 MHz.

The whole operation of the processing unit 301 configured as described above is controlled by a control unit 60 shown in FIG. 1a. As shown in FIG. 3, the control unit 60 includes a process controller 61 having a CPU for controlling each unit of the substrate processing apparatus 100 which includes the processing unit 301; a user interface 62; and a storage unit 63.

The user interface 62 includes a keyboard for a process manager to input a command to manipulate the substrate processing apparatus 100 including the processing unit 301, a display for visually displaying an operational status of the substrate processing apparatus 100 and the like.

The storage unit 63 stores therein control programs (software) and recipes including processing condition data and the like to be used in realizing various processes performed in the processing unit 301 under the control of the process controller 61. If necessary, a necessary recipe is retrieved from the storage unit 63 by an instruction from the user interface 62 and executed by the process controller 61, thereby performing a desired process in the processing unit 301 under the control of the process controller 61. Moreover, the recipe such as the control programs or the processing condition data can be retrieved from a computer-readable storage medium (e.g., a hard disk, a CD, a flexible disk, a semiconductor memory, or the like), or also can be transmitted on-line from another apparatus via, e.g., a dedicated line, when necessary.

When the semiconductor wafer W is plasma-etched by the processing unit 301 having the configuration described above, the gate valve 32 first is opened, and the semiconductor wafer W is loaded into the processing chamber 2 from the load-lock chamber 302 shown in FIG. 1A and mounted on the electrostatic chuck 11. Then, a DC voltage is applied from the DC power supply 13 thereto, so that the semiconductor wafer W is electrostatically attracted and held on the electrostatic chuck 11. Next, the gate valve 32 is closed, and the processing chamber 2 is exhausted to a predetermined vacuum level by the gas exhaust unit 35.

Thereafter, the valve 28 is opened, and a predetermined etching gas is introduced from the processing gas supply source 30 into a hollow portion of the upper electrode 21 through the processing gas supply line 27 and the gas inlet port 26 while its flow rate is controlled by the mass flow controller 29. Next, the etching gas is uniformly discharged toward the semiconductor wafer W through the gas injection openings 23 of the electrode plate 24, as indicated by arrows in FIG. 3.

Then, the pressure in the processing chamber 2 is maintained at a predetermined level. Next, a high frequency power of a predetermined frequency is applied from the first high frequency power supply 40 to the upper electrode 21. Accordingly, a high frequency electric field is generated between the upper electrode 21 and the susceptor 5 serving as the lower electrode. As a result, the etching gas is decomposed and turned into a plasma.

Meanwhile, a high frequency power of a frequency lower than that from the first high frequency power 40 is applied from the second high frequency power supply 50 to the susceptor 5 serving as a lower electrode. As a consequence, ions in the plasma are attracted toward the susceptor 5, and etching anisotropy is improved by ion assist.

Upon completion of the predetermined plasma etching process, the supply of the high frequency power and the processing gas is stopped, and the semiconductor wafer W is unloaded from the processing chamber 2 in the reverse sequence as described above.

In the substrate processing apparatus 100 having the above-described configuration, the semiconductor wafer W is transferred by the transfer mechanism 202 in the transfer chamber 201 shown in FIGS. 2A and 2B and then is subjected to the plasma etching process. The following is a description of a case where a plurality (e.g., 25) of semiconductor wafers W of one lot, which is accommodated in the FOUP F mounted on a left one of loading/unloading ports 203 shown in FIG. 1A, is processed by a center one of processing modules 300.

First of all, as indicated by arrows in FIG. 1A, the semiconductor wafers W accommodated in the FOUP F mounted on the left loading/unloading port 203 are unloaded and transferred to the center processing module 300 by the transfer mechanism 202 shown in FIGS. 2A and 2B (as indicated by a dotted line A in FIG. 1A).

Upon completion of the processing of the semiconductor wafers W transferred to the center processing module 300, the semiconductor wafers W being processed are transferred to the substrate accommodation unit 210 by the transfer mechanism 202 (as indicated by a dotted line B in FIG. 1A).

The semiconductor wafers W in the FOUP F are consecutively processed along the transfer routes A and B, and the semiconductor wafers W being processed are accommodated in the substrate accommodation unit 210. In the substrate accommodation unit 210, the nitrogen ($N_2$) gas flow is formed by the gas supply unit 215 and the gas flow gap 216. The transfer opening 211 of the substrate accommodation unit 210 is closed by the gate 213 except when the semiconductor wafer W is loaded and unloaded (FIG. 2A). Even when the semiconductor wafer W is load and unload, an opening having a minimum dimension is formed at a front side of the substrate accommodation unit 210 by moving the loading/unloading opening 214 to the loading/unloading position (FIG. 2B), wherein only a single semiconductor wafer W can be loaded and unloaded through the opening.

Therefore, the atmosphere in the transfer chamber 201 is difficult to be introduced into the substrate accommodation unit 210, so that the semiconductor wafers W being processed are prevented from being exposed to the atmospheric atmosphere for a long period of time. This can also prevent undesired reaction between moisture in the atmosphere and deposits such as by-products or the like adhered onto the semiconductor wafers W when the semiconductor wafers are processed by the processing module 300. At this time, the $N_2$ gas atmosphere can be effectively maintained compared to the case where the FOUP F is purged with the $N_2$ gas or the like while widely opening a front lid thereof, and this can reduce a required amount of $N_2$ gas.

For example, even when a target layer is plasma-etched by using fluorine-containing gas to expose copper wiring formed under the etching target layer, it is possible to prevent corrosion of the copper wiring by hydrofluoric acid generated from a reaction between by-products containing fluorine and moisture in the atmosphere.

As described above, the semiconductor wafers W in the FOUP F are consecutively transferred and processed by the processing module 300. After the last one of the semiconductor wafers W is transferred to be processed by the processing module 300, the processed semiconductor wafers W accommodated in the substrate accommodation unit 210 are transferred back to the FOUP F by the transfer mechanism 202 (as indicated by a dotted line C in FIG. 1A). After the transfer of the processed semiconductor wafers W to the FOUP F is begun, the FOUP F may be purged with the $N_2$ gas or the like.

The last semiconductor wafer W processed by the processing module 300 is directly transferred to the FOUP F by the transfer mechanism 202 without being transferred to the substrate accommodation unit 210 (as indicated by a dotted line D in FIG. 1A).

In order to improve throughput, it is preferable to directly transfer the last semiconductor wafer W to the FOUP F in a state where the processed semiconductor wafers W (e.g., 24 wafers in this embodiment) are accommodated in the FOUP F. However, in consideration of the relationship between a processing time in the processing module 300 and a transfer time of the processed semiconductor wafers W from the substrate accommodation unit 210 to the FOUP F, the processed wafers W may be transferred from the substrate accommodation unit 210 to the FOUP F when a second to the last semiconductor wafer W or a third to the last semiconductor wafer W starts to be processed.

For example, in the case where the processing time of a single semiconductor wafer W in the processing module 300 is about 120 seconds and the transfer time of the processed semiconductor wafer W from the substrate accommodation unit 210 to the FOUP F is about 10 seconds, the processed wafers W are transferred from the substrate accommodation unit 210 to the FOUP F when a second to the last semiconductor wafer W starts to be processed. That is, the twenty-three processed semiconductor wafers W are transferred from the substrate accommodation unit 210 to the FOUP F while processing of the second to the last semiconductor wafer W and the last semiconductor wafer W. Upon completion of the processing, the second to the last semiconductor wafer W and the last semiconductor wafer W are directly transferred to the FOUP F.

As described above, in accordance with the above-described embodiment, it is possible to prevent undesired reaction between deposits adhered onto a processed semiconductor wafer W and the atmosphere or moisture in the atmosphere.

Further, the present invention can be variously modified without being limited to the above-described embodiment. For example, the substrate processing apparatus may have a single processing module 300 instead of a plurality of processing modules 300. Moreover, the processing chamber may be provided to perform, e.g., film formation, other than plasma etching. The processing chamber for performing etching may be of a dual type in which high frequency powers are applied to the lower electrode, a single type in which a high frequency power is applied to the lower electrode or the like without being limited to a dual type in which high frequency powers are applied to the lower electrode and the upper electrode.

Besides, a substrate processing apparatus may be the substrate processing apparatus 101 having the vacuum transfer module 303 to which a plurality of processing modules 301 and the load-lock chambers 302 can be connected (FIG. 1B). Further, the substrate accommodation unit 210 may be connected to the transfer module 200, and may not be disposed side by side with the loading/unloading ports 203 (FIG. 1B).

While the invention has been shown and described with respect to the embodiments, it will be understood by those skilled in the art that various changes and modification may be made without departing from the scope of the invention as defined in the following claims.

What is claimed is:

1. A substrate processing apparatus comprising: a processing chamber for accommodating a substrate to be processed; a loading/unloading port configured to mount thereon a carrier accommodating therein a plurality of substrates; a transfer chamber including a transfer mechanism therein, the transfer mechanism transferring the substrate from the carrier in an atmospheric atmosphere; a load-lock chamber connected to the transfer chamber, the substrate being transferred to the processing chamber via the load-lock chamber; a substrate accommodation chamber accommodating substrates processed in the processing chamber and transferred by the transfer mechanism via the load-lock chamber, wherein the substrate accommodation chamber is positioned at a location spaced form the loading/unloading port, and wherein a transfer opening is provided between the substrate accommodation chamber and the transfer chamber; a vertically movable gate disposed inside the transfer chamber and separating the substrate accommodation chamber from the transfer chamber wherein the vertically movable gate includes a first side and an opposite second side, and wherein the first side faces toward an interior of the transfer chamber and the second side faces toward the substrate accommodation chamber, and wherein the vertically movable gate extends across the transfer opening between the substrate accommodation chamber and the transfer chamber such that portions of the vertically movable gate are provided both above and below the transfer opening in at least one position of the vertically movable gate; and a gas supply unit configured to supply a gas into the substrate accommodation chamber from an opposite side of the substrate accommodation chamber to the vertically movable gate, wherein the apparatus further includes an inert gas source coupled to the gas supply unit such that the gas supplied by the gas supply unit is an inert gas from the inert gas source, wherein the vertically movable gate has a slit-shaped opening extending in a horizontal direction and serving as a loading/unloading opening through which the processed substrates are transferred one at a time such that when a substrate is transferred between the transfer chamber and the substrate accommodation chamber the substrate passes through the slit-shaped opening and the transfer opening, wherein the processed substrates are vertically arranged in substantially parallel with each other in the substrate accommodation chamber, and wherein a gas flow gap is provided between the vertically movable gate and the substrate accommodation chamber on the second side of the vertically movable gate and along said portions of the vertically movable gate such that the gas traverses the substrate accommodation chamber from the opposite side of the substrate accommodation chamber, passes through the transfer opening, and is discharged into the transfer chamber via the gas flow gap when the gas is supplied from the gas supply unit.

2. The substrate processing apparatus of claim 1, wherein at least a substrate that has been processed last among the substrates that had been accommodated in the carrier is directly transferred to the carrier without being transferred to the substrate accommodation chamber.

3. The substrate processing apparatus of claim 1, wherein the substrates in the substrate accommodation chamber are transferred back to the carrier while a last substrate among the substrates accommodated in the carrier is processed in the processing chamber.

4. The substrate processing apparatus of claim 1, wherein the processing chamber is connected to the transfer chamber via the load-lock chamber.

5. The substrate processing apparatus of claim 1, further comprising a vacuum transfer chamber installed between the load-lock chamber and the processing chamber.

* * * * *